United States Patent
Saboundji

(10) Patent No.: US 12,203,153 B2
(45) Date of Patent: Jan. 21, 2025

(54) SUBLAYER FOR A NICKEL-BASED SUPERALLOY FOR ENHANCING THE LIFETIME OF THE PARTS AND IMPLEMENTATION METHOD THEREOF

(71) Applicant: SAFRAN, Paris (FR)

(72) Inventor: Amar Saboundji, Moissy-Cramayel (FR)

(73) Assignee: SAFRAN, Paris (FR)

( * ) Notice: Subject to any disclaimer, the term of this patent is extended or adjusted under 35 U.S.C. 154(b) by 0 days.

(21) Appl. No.: 18/040,322

(22) PCT Filed: Aug. 6, 2021

(86) PCT No.: PCT/FR2021/051450
§ 371 (c)(1),
(2) Date: Feb. 2, 2023

(87) PCT Pub. No.: WO2022/029393
PCT Pub. Date: Feb. 10, 2022

(65) Prior Publication Data
US 2023/0340645 A1 Oct. 26, 2023

(30) Foreign Application Priority Data
Aug. 6, 2020 (FR) ...................................... 2008317

(51) Int. Cl.
*B32B 15/01* (2006.01)
*B32B 15/04* (2006.01)
(Continued)

(52) U.S. Cl.
CPC ............ *C22C 19/057* (2013.01); *B32B 15/01* (2013.01); *B32B 15/016* (2013.01); *B32B 15/04* (2013.01);
(Continued)

(58) Field of Classification Search
CPC ..... C22C 19/057; C22C 19/058; C22C 19/03; C22C 21/00; C22C 30/00; B32B 15/016;
(Continued)

(56) References Cited

U.S. PATENT DOCUMENTS

| 2009/0274927 | A1 | 11/2009 | Narita |
| 2018/0195156 | A1* | 7/2018 | Reed ........................ C22C 19/05 |
| 2021/0062660 | A1* | 3/2021 | Saboundji ............. C23C 14/027 |

FOREIGN PATENT DOCUMENTS

WO 2009/0274927 10/2018

OTHER PUBLICATIONS

Long et al., "Microstructural and compositional design of Ni-based single crystalline superalloys—A review," in J. of Alloys and Compounds, 743 (2018), 203-220. (Year: 2018).*

(Continued)

*Primary Examiner* — Michael E. La Villa
(74) *Attorney, Agent, or Firm* — Pillsbury Winthrop Shaw Pittman LLP

(57) ABSTRACT

A nickel-based superalloy part includes a nickel-based superalloy substrate, and a metal sublayer covering the substrate, wherein the metal sublayer includes a first and a second layer, the first layer being located between the substrate and the second layer, the first layer including a first $\gamma'$-$Ni_3Al$ phase and a second $\gamma$-Ni phase, the second layer including a first $\gamma'$-$Ni_3Al$ phase, a second $\gamma$-Ni phase and a third $\beta$-NiAl phase, the average atomic fraction of aluminum in the second layer being strictly greater than the average atomic fraction of aluminum in the first layer.

8 Claims, 2 Drawing Sheets

(51) Int. Cl.
*B32B 15/20* (2006.01)
*C22C 19/03* (2006.01)
*C22C 19/05* (2006.01)
*C22C 21/00* (2006.01)
*C22C 30/00* (2006.01)
*C23C 10/06* (2006.01)
*C23C 10/14* (2006.01)
*C23C 14/02* (2006.01)
*C23C 14/16* (2006.01)
*C23C 28/00* (2006.01)
*C23C 28/02* (2006.01)
*C23C 30/00* (2006.01)
*F01D 5/28* (2006.01)

(52) U.S. Cl.
CPC ............ *B32B 15/043* (2013.01); *B32B 15/20* (2013.01); *C22C 19/03* (2013.01); *C22C 19/058* (2013.01); *C22C 21/00* (2013.01); *C22C 30/00* (2013.01); *C23C 10/06* (2013.01); *C23C 10/14* (2013.01); *C23C 14/025* (2013.01); *C23C 14/027* (2013.01); *C23C 14/165* (2013.01); *C23C 28/02* (2013.01); *C23C 28/021* (2013.01); *C23C 28/022* (2013.01); *C23C 28/023* (2013.01); *C23C 28/028* (2013.01); *C23C 28/3215* (2013.01); *C23C 30/00* (2013.01); *C23C 30/005* (2013.01); *F01D 5/28* (2013.01); *F01D 5/288* (2013.01); *F05D 2230/31* (2013.01); *F05D 2260/95* (2013.01); *F05D 2300/175* (2013.01); *Y10T 428/12736* (2015.01); *Y10T 428/1275* (2015.01); *Y10T 428/12764* (2015.01); *Y10T 428/12931* (2015.01); *Y10T 428/12944* (2015.01); *Y10T 428/2495* (2015.01); *Y10T 428/24959* (2015.01); *Y10T 428/24967* (2015.01); *Y10T 428/26* (2015.01); *Y10T 428/263* (2015.01); *Y10T 428/264* (2015.01); *Y10T 428/265* (2015.01)

(58) Field of Classification Search
CPC ....... B32B 15/01; B32B 15/04; B32B 15/043; B32B 15/20; C23C 10/06; C23C 14/025; C23C 14/027; C23C 14/165; C23C 28/023; C23C 28/028; C23C 28/02; C23C 28/021; C23C 28/022; C23C 28/3215; C23C 30/00; C23C 30/005; F01D 5/288; F01D 5/28; F05D 2230/31; F05D 2260/95; F05D 2300/175; Y10T 428/12944; Y10T 428/12931; Y10T 428/12736; Y10T 428/1275; Y10T 428/12764; Y10T 428/2495; Y10T 428/24959; Y10T 428/24967; Y10T 428/263; Y10T 428/264; Y10T 428/265; Y10T 428/26
See application file for complete search history.

(56) References Cited

OTHER PUBLICATIONS

International Search Report as issued in International Patent Application No. PCT/FR2021/051450, dated Nov. 16, 2021.
Rougier, L., et al. "Numerical simulation of AM1 microstructure," MATEC Web of Conferences, Jan. 2014, Retrieved from the Internet: URL:https://www.matec-conferences.org/articles/matecconf/pdf/2014/05/matecconfeurosuperalloys14 11003.pdf>, XP055788886, 6 pages.

* cited by examiner

[Fig. 1]
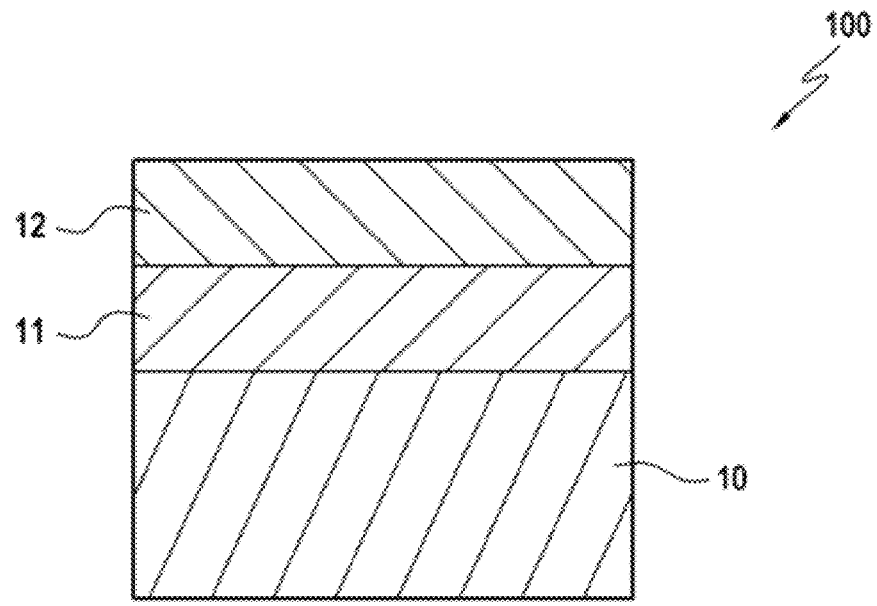
[Fig. 2]
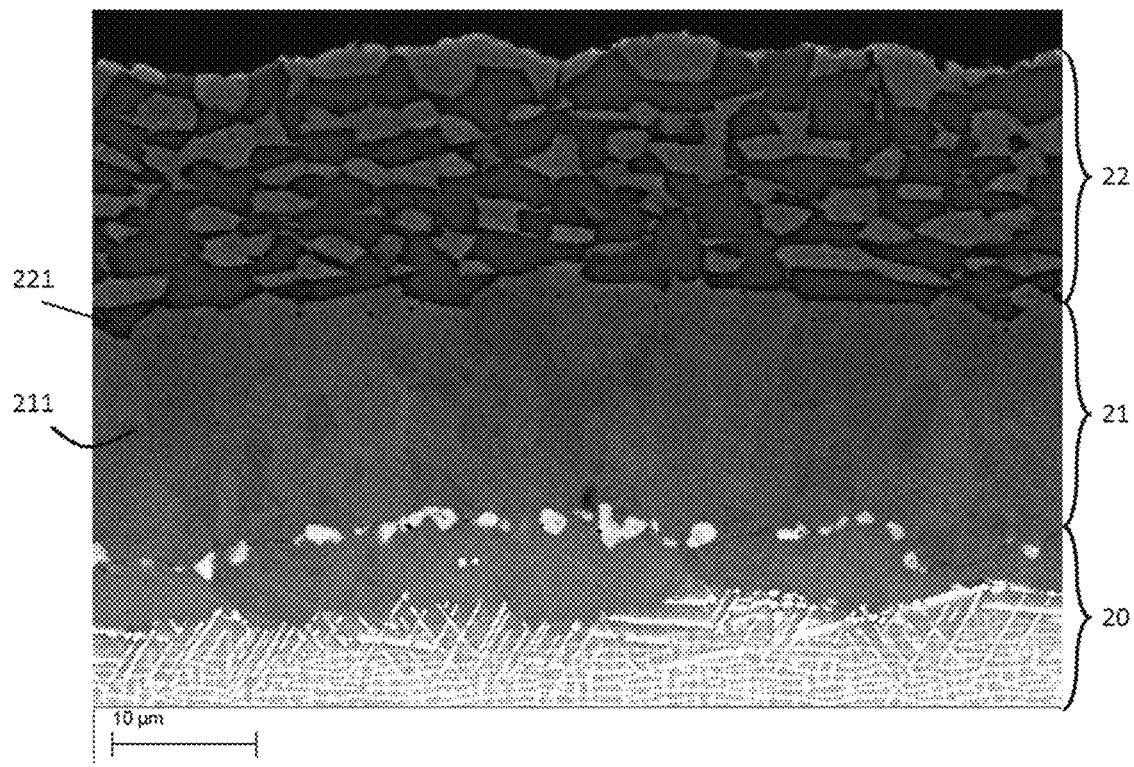

[Fig. 3]
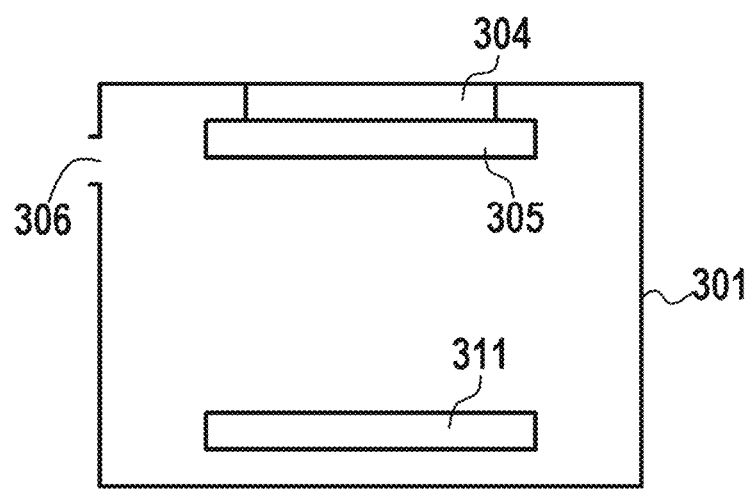

SUBLAYER FOR A NICKEL-BASED SUPERALLOY FOR ENHANCING THE LIFETIME OF THE PARTS AND IMPLEMENTATION METHOD THEREOF

CROSS-REFERENCE TO RELATED APPLICATIONS

This application is the U.S. National Stage of PCT/FR2021/051450, filed Aug. 6, 2021, which in turn claims priority to French patent application number 20 08317 filed Aug. 6, 2020. The content of these applications are incorporated herein by reference in their entireties.

TECHNICAL FIELD

The invention falls within the field of turbomachinery parts, in particular aeronautical turbomachines, and particularly turbine blades or distributor vanes. The present invention relates to coatings for substrates and more specifically to sublayers deposited on the surface of metal substrates and preparation methods thereof.

PRIOR ART

Thermal barriers allow to protect substrates in high temperature environments. In operation at such temperatures, the diffusion phenomena which are thermally activated can induce significant modifications between the substrate and the sublayer on the substrates and their chemical compositions consequently reducing the lifetime of the whole part.

Thermal barriers are usually placed on sublayers, coating the substrates, and which allow to ensure the cohesion of the thermal barrier with the substrate.

Among the sublayers conventionally used for nickel-based superalloys, mention may in particular be made of coatings composed of nickel aluminides or else $\gamma$-Ni/$\gamma'$-Ni$_3$Al coatings.

Nickel aluminide coatings generally have aluminum atomic contents of the order of 40 atomic %, which allows to form an alumina oxide that protects against corrosion and oxidation. Nevertheless, the high aluminum content, compared to the substrates, causes interdiffusion phenomena, namely the migration of nickel from the substrate to the coating and of aluminum from the coating to the substrate. These phenomena are thermally activated, therefore amplified by the use of the coated substrate at high temperature, and ultimately cause a significant reduction in the lifetime of the coated parts. For example, the substrates can, in the various intended applications, be subject to temperatures of the order of 1000° C., for example between 1000° C. and 1100° C.

Indeed, the diffusion of aluminum promotes the martensitic transition in the coating, which can generate cracks and promote the flaking of the alumina layer. The interdiffusion can also create secondary reaction areas that degrade the mechanical properties of the coated superalloy.

The $\gamma$-Ni/$\gamma'$-Ni$_3$Al coatings have a chemical composition closer to that of the nickel-based superalloy substrate, which limits interdiffusion phenomena. In addition, the close chemical composition between the substrate and the coating also allows to suppress the appearance of secondary reaction areas. However, the aluminum content of $\gamma$-Ni/$\gamma'$-Ni$_3$Al coatings is of the order of 15-20 atomic % and does not allow the substrates to have an oxidation resistance comparable to that of nickel aluminides and the lifetime of the superalloy parts is therefore reduced.

Therefore, there remains a need for a coated nickel-based superalloy part having on the one hand limited interdiffusion phenomena, and on the other hand increased resistance to oxidation and corrosion compared to the coated parts of the prior art.

DISCLOSURE OF THE INVENTION

The invention aims at meeting this need by proposing a nickel-based superalloy part comprising:
a nickel-based superalloy substrate; and
a metal sublayer covering the substrate,
characterized in that the sublayer comprises a first and a second layer, said first layer being located between the substrate and the second layer, said first layer comprising a first $\gamma'$-Ni$_3$Al phase and a second $\gamma$-Ni phase, said second layer comprising a first $\gamma'$-Ni$_3$Al phase, a second $\gamma$-Ni phase and a third $\beta$-NiAl phase, the average atomic content of aluminum in the second layer being strictly greater than the average atomic content of aluminum in the first layer.

Such a sublayer allows on the one hand to limit the interdiffusion phenomena in the part, in particular between the substrate and the second layer, because the first layer has an aluminum content closer to that of the substrate than the second layer. In addition, the second layer, placed above the first layer, allows to form an alumina layer and thus to increase the resistance to oxidation of the nickel-based superalloy substrate.

In one embodiment, the first layer does not comprise any phase other than the first $\gamma'$-Ni$_3$Al phase and the second $\gamma$-Ni phase.

In one embodiment, the second layer does not comprise any phase other than the first $\gamma'$-Ni$_3$Al phase, the second $\gamma$-Ni phase, and the third $\beta$-NiAl phase.

In one embodiment, the sublayer does not comprise any layers other than the first and second layer.

In one embodiment, the average atomic content of aluminum of the first layer is up to 4% greater, or else between 2% and 4% greater than the average atomic content of aluminum of the substrate.

In one embodiment, the average atomic content of aluminum of the second layer is up to 4% greater, or else between 2% and 4% greater than the average atomic content of aluminum of the first layer.

The average atomic content of aluminum is understood as the value of the average atomic content of aluminum over the entire layer, or, where applicable, the concerned area. It is understood that particular care will be taken to make a representative measurement of the composition of the layer (or area) as a whole, since indeed, the multiphase nature of the latter can locally induce marked differences in concentrations if the measurement is performed only locally.

As indicated above, the metal sublayer comprises a first layer comprising a first $\gamma'$-Ni$_3$Al phase and a second $\gamma$-Ni phase.

In one embodiment, the first layer may comprise a plurality of areas, each comprising a first $\gamma'$-Ni$_3$Al phase and a second $\gamma$-Ni phase, each of the areas having an average aluminum content greater than the directly underlying area.

In other words, the first layer can comprise a plurality of areas, together forming in the first layer a gradient of average atomic content of aluminum. For example, each of the areas of the first layer can have an average atomic content of aluminum up to 4% greater, or else between 2% and 4% greater than the average atomic content of aluminum of the area directly below, said areas having a thickness of 1 μm to 5 μm.

A first layer comprising a plurality of areas allows to gradually switch from a structure close to that of the substrate to a structure richer in aluminum, and thus to avoid a sudden variation in the concentration of aluminum, and thus to limit the interdiffusion phenomena.

It is understood that the thickness of an area or, where applicable, of a layer, is measured in the direction normal to the substrate.

As indicated above, the metal sublayer comprises a second layer comprising a first γγ'-$Ni_3Al$ phase, a second γ-Ni phase and a third β-NiAl phase.

In one embodiment, the second layer may comprise a plurality of areas each comprising a first γ'-$Ni_3Al$ phase, a second γ-Ni phase and a third β-NiAl phase, each of the areas having an average atomic content of aluminum greater than the underlying area.

In other words, all the areas of the second layer of the sublayer can have a gradient of the average atomic content of aluminum. For example, each of the areas of the second layer can have an average atomic content of aluminum up to 4% greater, or else between 2% and 4% greater than the average atomic content of aluminum of the area directly below, said areas having a thickness of 1 μm to 5 μm.

A second layer having such a plurality of areas allows to gradually move from a structure close to that of the first layer to a structure even richer in aluminum and thus to avoid a sudden variation in the concentration of aluminum, and thus to limit the interdiffusion phenomena.

This progressive variation in the atomic content of aluminum in the second layer allows, on the one hand, to have good adhesion between the sublayer and the substrate while limiting the interdiffusion phenomena and, on the other hand, to have good adhesion between the substrate, the first layer and the second layer.

In one embodiment, the average atomic content of aluminum in the second layer or, where appropriate, in the last area of the second layer can be comprised between 7 and 15% by mass.

In one embodiment, the total content of γ-Ni in the metal sublayer is comprised between 5.0% and 20.0% by mass, relative to the total weight of the sublayer.

In one embodiment, the total content of γ'-$Ni_3Al$ in the metal sublayer is comprised between 40.0% and 90.0% by mass relative to the total weight of the sublayer. For example comprised between 40.0% and 89.8% by mass.

In one embodiment, the total content of β-NiAl in the metal sublayer is comprised between 5.0% and 40.0% by mass relative to the total weight of the sublayer.

It has been observed by the inventors that the contents of γ-Ni, of γ'-$Ni_3Al$ and of β-NiAl as proposed above allow to obtain a metal sublayer having an optimum between, on the one hand, the limitation of interdiffusion phenomena, in particular the diffusion of aluminum, and on the other hand, an aluminum content allowing the is formation of an alumina layer protecting the substrate against corrosion and oxidation.

In one embodiment, the total content of hafnium Hf in the metal sublayer is comprised between 0.2% and 2.0% by mass relative to the total weight of the sublayer.

In another embodiment, the multilayer metal sublayer may also comprise chromium Cr. For example, the average chromium content can be comprised between 3% and 10% by mass. However, the chromium should not be present in amounts that could cause it to form a different phase in the first or second layer.

The presence of chromium in a sublayer of the invention allows to further increase the resistance of the metal sublayer to corrosion.

In one embodiment, the substrate may be a nickel-based superalloy comprising γ-Ni and γ'-$Ni_3Al$ phases, and preferably comprising only γ-Ni and γ'-$Ni_3Al$ phases. In one embodiment, the total content of γ phase in the substrate is comprised between 20% and 40% by mass relative to the total weight of the substrate, and preferably between 25% and 35% by mass relative to the total weight of the substrate.

In one embodiment, the substrate is a nickel-based single crystal superalloy.

In one embodiment, the first layer is directly in contact with the substrate, and the second layer is directly in contact with the first layer.

In one embodiment, the first and/or the second layer comprise, in addition to aluminum and nickel, one or more elements selected from chromium, hafnium, cobalt, platinum, silicon, tantalum, tungsten, molybdenum, rhenium.

In one embodiment, the first and/or the second layer do not comprise elements other than elements selected from nickel, aluminum, chromium, hafnium, cobalt, platinum, silicon, tantalum, tungsten, molybdenum, rhenium.

According to another of its aspects, the invention also relates to a method for manufacturing a part as described above in which the deposition of each of the layers of the metal sublayer is carried out by a physical method in the vapor phase.

In one embodiment, the method can be carried out in a single enclosure by co-evaporation or co-sputtering of several sources disposed in a single physical vapor is deposition enclosure.

Such an embodiment allows to deposit each of the layers of the metal sublayer by precisely controlling the content of each of its components.

For example, a part as described above can be obtained in the course in a single enclosure by a magnetron cathode co-sputtering method.

DESCRIPTION OF EMBODIMENTS

FIG. 1 is a schematic representation of a part according to one embodiment of the invention.

FIG. 2 is a micrograph of a part according to one embodiment of the invention.

FIG. 3 schematically shows a physical vapor deposition enclosure according to one embodiment of the invention.

DESCRIPTION OF EMBODIMENTS

Embodiments of the invention are now described by means of figures. However, the invention is not limited to these embodiments alone. The figures are for illustrative purposes and should not be construed as limiting the invention.

FIG. 1 schematically shows a part 100 according to the invention.

The part comprises a substrate 10, made of nickel-based superalloy, and a sublayer, comprising a first layer 11 and a second layer 12.

As described above, the first layer 11 comprises an average atomic content of aluminum greater than that of the substrate 10.

The scope of the invention is not departed from, when the first layer 11 comprises a plurality of areas, each comprising an average atomic content of aluminum greater than that of the underlying area.

For example, it is possible for the first layer 11 to be composed of a plurality of areas each having a thickness comprised between 1 µm and 5 µm, the average atomic content of aluminum in each of the areas being greater than the average atomic content of aluminum of the underlying area.

For example, the average atomic content of aluminum in each area of the first layer can be up to 4% greater, or else between 2 and 4% greater than the average atomic content of aluminum of the underlying area.

Also, the part 100 comprises a second layer 12 whose average aluminum content is greater than the average aluminum content of the first layer 11.

The scope of the invention is not departed from when the second layer 12 comprises a plurality of areas, each comprising an aluminum concentration greater than that of the underlying area.

For example, it is possible for the second layer 12 to be composed of a plurality of areas having a thickness comprised between 1 µm and 5 µm, the average aluminum content in each of the areas being greater than the average aluminum content of the underlying area.

For example, the average atomic content of aluminum in each area of the second layer can be up to 4% greater, or else between 2% and 4% greater than the average atomic content of aluminum of the underlying area.

It is also possible for the first 11 and the second layer 12 to each comprise several areas as described above.

In one embodiment not shown, the first area of the first layer comprises an average atomic content of aluminum 2 to 4% greater than the average atomic content of aluminum in the substrate, the second area of the first layer comprises an average atomic content of aluminum of 2 to 4% greater than the average atomic content of the first area, and so on until the second layer, the first area of which comprises an average atomic content of aluminum of 2% to 4% greater than the last area of the first layer, and so on until the last area of the second layer. As above, the areas have a thickness comprised between 1 µm and 5 µm.

The progressive variation of the aluminum content allows, in all the embodiments considered above, to obtain a sublayer whose upper portion has an average atomic content of aluminum greater than that of the substrate, while minimizing the interdiffusion effects or the creation of secondary reaction areas thanks to a progressive variation of the average atomic content of aluminum.

As described above, it is understood that the last area of the second layer comprises the γ-Ni, γ'-Ni$_3$Al and β-NiAl phases.

In one embodiment, the first layer 11 comprises between 1 and 4 areas, and the second layer 12 comprises between 1 and 4 areas.

In one embodiment, the first layer 11 comprises between 1 or 2 areas, and the second layer 12 comprises between 1 or 2 areas.

In one embodiment, the first layer 11 comprises a single area, and the second layer 12 comprises a single area.

It has also been observed that a sublayer as described above allows, if desired, to deposit a thermal barrier layer on the face opposite the substrate of the second layer, in particular guaranteeing good adhesion of the latter.

The gradual increase in the average atomic content of aluminum in a sublayer as proposed allows to ensure that each of the layers forming the sublayer is sufficiently close in composition to have a high adhesion with the directly underlying layer. The gradual increase allows to go from the first layer to the second layer without having to change the deposition method. Indeed, the β-NiAl phase appears naturally at high aluminum contents and thus one simply goes from the first to the second layer.

In addition, the presence of numerous areas in the first and second area increases the number of grain boundaries, which further slows down the interdiffusion of nickel or aluminum between the layers.

In one embodiment, chromium is also present in the first and second layers. The amount of chromium can be adjusted depending on the exact properties desired for the sublayer.

In one embodiment, the chromium content in each of the first and second layers varies opposite to the aluminum content.

In one embodiment, the increase in the average atomic content of aluminum in the metal sublayer or, where applicable, in each of the areas of each of the layers of the sublayer is fully compensated by a decrease in the average atomic content of chromium in said sublayer.

In one embodiment, the average atomic content of chromium in a layer, or where appropriate an area of a layer, can be comprised between 7% and 17%.

Of course, the chromium content is chosen such that it does not affect the desired γ/γ' or γ/γ'/β structures for the first and second layers.

FIG. 2 is a micrograph obtained by scanning electron microscopy of a part according to one embodiment of the invention.

The substrate 20 is covered with a first layer 21 and a second layer 22.

On the micrograph shown in FIG. 2, the γ and γ' phases 211 appear lighter than the β phases 221.

In one embodiment, the deposition can be carried out by physical vapor deposition. Mention may in particular be made of deposition methods by cathode sputtering, by pulsed laser ablation, by Joule evaporation or else by electron impact.

Preferably, the deposition method is selected from magnetron cathode sputtering or evaporation.

FIG. 3 schematically shows a device allowing to carry out a deposition by magnetron cathode sputtering.

In a chamber 301, a gas is introduced through the inlet 306 and a plasma is generated between the target 305 disposed near a magnet 304 and the substrate 311.

For example, the following parameters, taken in their usual definition for a magnetron cathode sputtering method, allows to obtain a sublayer conforming to a part of the invention. The ion bombardment can be carried out with a potential comprised between −200 V to 400 V for 10 to 30 minutes. The deposition is performed at a power density comprised between 3 to 10 W/cm$^2$, heating during deposition is comprised between 200 to 700° C., the bias is comprised between −150 V to −300 V, and the pressure is comprised between 0.1 and 2.0 Pa.

In one embodiment, several targets corresponding to the materials to be deposited are introduced into the physical vapor deposition chamber. It is thus possible to create the sublayer layer by layer, or if necessary area after area, in a single enclosure, by adjusting the deposition conditions to ensure that the composition of each layer, or if necessary each area of the first layer then the second layer, has the desired composition.

EXAMPLE

Several compositions comprising elements in different contents were simulated with the JPMATPro-V10 software.

For each of these compositions, the content of each of the γ-Ni, γ'-Ni₃Al and β-NiAl phases was determined by the software.

In table 1, the contents of the elements are given in atomic percentages and the contents of the phases are expressed in mass percentages.

It is observed that the content of each of the γ-Ni, γ'-Ni₃Al and β-NiAl phases of compositions 1 to 3 satisfy the desired conditions for the second layer of claim 1, while compositions 4 and 5 do not satisfy said conditions.

TABLE 1

|   | Ni | Al | Cr | Co | Hf | Pt | Si | Ta | W | β | γ | γ' |
|---|----|----|----|----|----|----|----|----|----|----|----|----|
| 1 | Base | 22 | 10 | 1 | 0.6 | 3 | 0.8 | 0.3 | 0.3 | 20 | 20 | 60 |
| 2 | Base | 24 | 9 | 1 | 0.6 | 2 | 0.8 | 0.3 | 0.3 | 38 | 17 | 45 |
| 3 | Base | 23 | 9 | 2.2 | 1 | 10 | 1 | 0.3 | 0.5 | 30 | 10 | 50 |
| 4 | Base | 28 | 0 | 0 | 0 | 3 | 0 | 0 | 0 | 10 | 0 | 90 |
| 5 | Base | 28 | 1 | 0 | 0.3 | 3 | 0.2 | 0 | 0 | 22 | 0 | 78 |

The table above shows that it is not the individual content of each element, but an effect of the content of each of the elements which is decisive in the presence or absence of the γ-Ni, γ'-Ni₃Al and β-NiAl phases, and the relative proportion of each of them.

The invention claimed is:

1. A nickel-based superalloy part comprising:
a nickel-based superalloy substrate; and
a metal sublayer covering the substrate,
wherein the metal sublayer comprises a first and a second layer, said first layer being located between the substrate and the second layer, said first layer comprising a first γ'-Ni₃Al phase and a second γ-Ni phase, said second layer comprising a first γ'-Ni₃Al phase, a second γ-Ni phase and a third β-NiAl phase, an average atomic content of aluminum in the second layer being greater than the average atomic content of aluminum in the first layer, and in which a total content of γ-Ni in the metal sublayer is comprised between 5.0% and 20.0% by mass, a total content of γ'-Ni₃Al in the metal sublayer is comprised between 40.0% and 90.0% by mass and a total content of β-NiAl in the metal sublayer is comprised between 5.0% and 40.0% by mass relative to the total weight of the sublayer,
wherein the first layer comprises a plurality of first areas, wherein a lowermost area of the plurality of first areas comprises an average atomic content of aluminum greater than an average atomic content of aluminum of the substrate, wherein an aluminum content difference between the substrate and the lowermost area of the plurality of first areas is up to 4%, and each remaining first area of the plurality of first layers comprising an average content of aluminum greater than an average atomic content of aluminum of an area directly below, wherein each aluminum content difference is up to 4%, said first areas having a thickness of 1 μm to 5 μm, and
wherein the second layer comprises a plurality of second areas, wherein a lowermost area of the plurality of second areas comprises an average atomic content of aluminum greater than an average atomic content of aluminum of an uppermost area of the plurality of first areas, wherein an aluminum content difference between the uppermost area of the plurality of first areas and the lowermost area of the plurality of second areas is up to 4%, and each remaining second area of the plurality of second layers comprising an average content of aluminum greater than an average atomic content of aluminum of an area directly below, wherein each aluminum content difference is up to 4%, said second areas having a thickness of 1 μm to 5 μm.

2. A nickel-based superalloy part comprising:
a nickel-based superalloy substrate; and
a metal sublayer covering the substrate,
wherein the metal sublayer comprises a first and a second layer, said first layer being located between the substrate and the second layer, said first layer comprising a first γ'-Ni₃Al phase and a second γ-Ni phase, said second layer comprising a first γ'-Ni₃Al phase, a second γ-Ni phase and a third β-NiAl phase, an average atomic content of aluminum in the second layer being greater than the average atomic content of aluminum in the first layer, and in which a total content of γ-Ni in the metal sublayer is comprised between 5.0% and 20.0% by mass, a total content of γ'-Ni₃Al in the metal sublayer is comprised between 40.0% and 90.0% by mass and a total content of β-NiAl in the metal sublayer is comprised between 5.0% and 40.0% by mass relative to the total weight of the sublayer,
wherein the first layer comprises a plurality of first areas, each of the first areas of the first layer comprising an average content of aluminum greater than an average atomic content of aluminum of an area directly below wherein a content difference is up to 4%, said first areas having a thickness of 1 μm to 5 μm, and
wherein the second layer comprises a plurality of second areas having an average atomic content of aluminum greater than an average atomic content of aluminum of an area directly below wherein a content difference is up to 4%, said second areas having a thickness of 1 μm to 5 μm.

3. The part according to claim 2, wherein a total content of hafnium Hf in the metal sublayer is comprised between 0.2% and 2.0% by mass relative to the total weight of the metal sublayer.

4. The part according to claim 2, wherein the average atomic content of aluminum of the first layer is between 2% and 4% higher than an average atomic content of aluminum of the substrate.

5. The part according to claim 2, wherein the average atomic content of aluminum of the second layer is between 2% and 4% higher than the average atomic content of aluminum of the first layer.

6. The part according to claim 2, wherein the total content of γ phase in the substrate is comprised between 20% and 40% by mass relative to the total weight of the substrate.

7. A method for preparing a part according to claim 2, comprising depositing each layer of the metal sublayer by a physical method in the vapor phase.

8. The preparation method according to claim 7, wherein the method is carried out in a single enclosure by co-evaporation or co-sputtering of several sources disposed in the single enclosure.

* * * * *

UNITED STATES PATENT AND TRADEMARK OFFICE
CERTIFICATE OF CORRECTION

| | | |
|---|---|---|
| PATENT NO. | : 12,203,153 B2 | Page 1 of 1 |
| APPLICATION NO. | : 18/040322 | |
| DATED | : January 21, 2025 | |
| INVENTOR(S) | : Amar Saboundji | |

It is certified that error appears in the above-identified patent and that said Letters Patent is hereby corrected as shown below:

On the Title Page

Item (56): FOREIGN PATENT DOCUMENTS, a reference was omitted and should be listed as follows:
WO 2018/178603 A1 10/2018

Signed and Sealed this
Eighteenth Day of February, 2025

Coke Morgan Stewart
*Acting Director of the United States Patent and Trademark Office*